United States Patent [19]
Smith et al.

[11] Patent Number: 5,829,514
[45] Date of Patent: Nov. 3, 1998

[54] BONDED CAST, PIN-FINNED HEAT SINK AND METHOD OF MANUFACTURE

[75] Inventors: Dean L. Smith, Pittsford; Edmund J. Sobresky, Batavia; Roger S. Kerr, Brockport, all of N.Y.

[73] Assignee: Eastman Kodak Company, Rochester, N.Y.

[21] Appl. No.: 959,692

[22] Filed: Oct. 29, 1997

[51] Int. Cl.$^6$ ......................................................... F28F 7/00
[52] U.S. Cl. .......................... 165/78; 165/80.3; 165/185; 174/16.3; 257/722; 361/704
[58] Field of Search .................. 165/80.3, 185, 165/78; 174/16.3; 257/722; 361/704

[56] References Cited

U.S. PATENT DOCUMENTS

| | | |
|---|---|---|
| 4,777,560 | 10/1988 | Herrell et al. . |
| 4,884,331 | 12/1989 | Hinshaw . |
| 5,042,257 | 8/1991 | Kendrick et al. ............................ 62/3.1 |
| 5,304,846 | 4/1994 | Azar et al. . |
| 5,504,650 | 4/1996 | Katsui et al. ............................ 165/80.3 |
| 5,655,600 | 8/1997 | Dewar et al. ............................ 165/185 X |

FOREIGN PATENT DOCUMENTS

| | | | |
|---|---|---|---|
| 294570 | 10/1992 | Japan ......................................... 257/722 |
| 2167905 | 6/1986 | United Kingdom ..................... 165/185 |

OTHER PUBLICATIONS

Catalogue material—Augmented Surface Bonded Heat Sinks published by AAVID™ Thermal Technologies, Inc. (Mar. 1996).

*Primary Examiner*—Leonard R. Leo
*Attorney, Agent, or Firm*—Clyde E. Bailey, Sr.

[57] ABSTRACT

A high performance, high pin fin density heat sink (10) has mating first and second opposing base members (22, 24) having first and second pin fins (18, 20) extending generally perpendicularly therefrom. The pin fins (18, 20) are generally cylindrical and each bonded into recesses (30, 32) formed on the opposing base member (22, 24). The spaces between nearest adjacent first and second pin fins (18, 20) form narrow fluid passageways (12) having a gas inlet in (14) for communicating with a heat generating body and gas out let end (16).

14 Claims, 6 Drawing Sheets

BONDED CAST, PIN-FINNED HEAT SINK AND METHOD OF MANUFACTURE

FIELD OF THE INVENTION

The invention relates to heat sinks, more particularly, the invention concerns bonded, pin-finned heat sinks having high fin density enabling exceptional thermal performance, and the method of making same.

BACKGROUND OF THE INVENTION

Existing high performance heat sinks are characterized by a high fin density design, i.e., a fin population about twice that which can be normally produced in a standard production process. In this case, the surface area has a major influence on the overall heat transfer capability of the heat sink. Additionally for existing heat sinks having tightly spaced fins, the heat transfer coefficient is determined by the hydraulic diameter of the heat sink design. Hydraulic diameter is generally defined in the art as four times the area of the channel (i.e., space or distance between adjacent fins) divided by the perimeter of the channel. Thus, the smaller the hydraulic diameter, the higher both the heat transfer coefficient and the heat transfer of the heat sink.

One such design is illustrated in U.S. Pat. No. 4,777,560 by Herrell et al in which a high performance, high fin density heat sink is described. According to Herrell et al., various alternative heat sink construction techniques are described that produce high fin density design. An inherent disadvantage of the design is the inability to maximize the surface area of each individual fin. Approximately 25% to 33% of the potential individual fin surface area is not available, as this area is in contact with the adjacent fin (See for instance Herrell et al, FIGS. 1, 2, 3 and 4). In addition, heat sinks based on FIGS. 1 and 2 in Herrell et al have an internal plenum that further decreases available surface area for a given volume of a heat sink design. Thus, Herrell et al do not teach maximizing heat sink surface area, for a given heat sink volume.

In U.S. Pat. No. 5,304,846 to Azar et al, a heat sink design is disclosed that maximizes fin surface area in a high performance, high fin density heat sink. According to Azar et al., the manufacturing techniques disclosed are crystal-orientation-dependent etching, precision sawing, electric discharge machining, or numerically controlled machining. A major shortcoming of the Azar et. al. heat sink design is that they are generally difficult to manufacture. Additionally, the Azar et. al. heat sink requires enormously high production cycle time to manufacture which, of course, makes them cost ineffective.

In U.S. Pat. No. 4,884,331 by Hinshaw, a method of manufacturing a pin-finned heat sink from an extrusion is described. According to the cross cut machine method disclosed in Hinshaw, the maximum pin fin density that can be achieved is limited to what is obtainable by an extrusion process. This latter limitation clearly would not be acceptable in the heat sink design of the present invention. Another shortcoming of Hinshaw is that only square or rectangular pin fins can be manufactured, no round or elliptical profiles are available Moreover, there exists various heat sink manufacturers that offer bonded fin heat sink assemblies in which each fin in the assembly is individually bonded into a heat sink base. (See for instance, catalogue material on Augmented surface Bonded Heat Sinks published by AAVID™ Thermal Technologies, Inc. (Mar. 1996). A major shortcoming, however of the AAVID™ heat sinks is there enormously high cost. This cost is related directly to the labor required to individually arrange each fin on some sort of support or substrate and high production cycle time.

Therefore, a need persists for a high performance, high fin density heat sink that maximizes heat sink surface area and is cost effective and simple to manufacture.

SUMMARY OF THE INVENTION

It is, therefore, an object of the invention is to provide a dual cast in finned bonded heat sink that has a high pin fin density and a plurality of fluid flow channels defined by open spaces between nearest adjacent pin fins of bonded heat sink members.

Yet another objective of the invention is to provide a method of making a high pin finned density, high performance cast heat sink.

Still another object of the invention is to provide a method of manufacturing a high performance, high pin finned density cast heat sink that is cost effective.

Yet another object of the invention is to provide a plurality of integral ducts or fluid channels for the heat sink that insures that all air flow goes through the heat sink with no air by-pass.

Still another object of the invention is to provide a heat sink that permits a uni-directional air stream flow through the gas passageways.

Yet another object of the invention is to provide a heat sink in which the fin geometry is not limited by the method of manufacture.

It is a feature of the heat sink of the present invention that a plurality of cast vertically extending pin fins in opposing base members have an end portion arranged and bonded into recesses formed in common faces of the opposed base members.

To overcome one or more problems in the prior art, there is provided, in one aspect of the invention, a heat sink that has a cast first base member having a plurality of spaced, substantially parallel first pin fins extending substantially perpendicular from a common first face of the first base member. A cast second base member having a plurality of spaced, substantially parallel second pin fins extending substantially perpendicular from a common second face of the second base member opposes the first base member. The plurality of second pin fins of the common second face are configured to bond with the common first face of the first base member; and, the plurality of first pin fins of the first base member are configured to bond with the common second face of the second opposing base member. Also provided in the common first and second face of the base members are first and second means for receiving each one of the plurality of spaced first and second pin fins, respectively.

Moreover, means is provided for fixing, by preferably bonding, each one of the plurality of first and second pin fins against movement in a corresponding one of the first and second means for receiving, respectively. In the assembled heat sink of the invention, nearest adjacent first and second pin fins bonded in a respective opposing common face form a plurality of narrow gas passageways therebetween.

In another aspect of the invention, a heat sink has a cast first base member having a plurality of spaced, substantially parallel, first and second pin fins each extending substantially perpendicular from a common first face and wherein the first pin fins are somewhat longer than the second pin fins. Further, a cast base support member has a plurality of spaced, substantially parallel, third and fourth pin fins extending from a common second face, and wherein the third pin fins are somewhat longer than the fourth pin fins. A first means is provided in the common first face for receiving the spaced third pin fins. Also, second means is provided in the common second face for receiving the spaced first pin fins. Further provided are means for fixing, by preferably bonding, the spaced first and third pin fins against movement in their respective means for receiving, similar to the above described embodiment.

In yet another aspect of the invention, a method of making a thermally efficient heat sink includes the steps of (a) providing a mold for casting first and second base members, and then (b) casting the first and second base members in accordance with the description above. The cast base members are then aligned and assembled to form the heat sink described in the above embodiments of the invention.

It is, therefore, an advantageous effect of the invention that a high performance, high fin density pin finned cast heat sink is cost effective to manufacture, simply constructed, and has a wide variety of uses.

BRIEF DESCRIPTION OF THE DRAWINGS

The foregoing as well as other objects, features and advantages of this invention will become more apparent from the appended Figures, wherein like reference numerals denote like elements, and wherein.

DETAILED DESCRIPTION OF THE INVENTION

Turning now to the drawings, and more particular to FIGS. 1–6, there is illustrated the heat sink 10 in accordance with the principles of the invention. Broadly defined, heat sink 10 comprises a plurality of closely spaced narrow gas passageways 12 having a gas inlet end 14 adaptable for receiving heat from a heat generating body (not shown) and a gas outlet end 16 upstream of the gas inlet end 14. Narrow gas passageways 12 are formed by spaced apart first and second pin fins 18, 20 each being fixed in a respective cast base member (described below). Thus gas, such as heat, generated by a heat generating body (not shown) will pass through gas inlet end 14 and then flow unidirectionally through a path defined by numerous spaced gas passageways 12 (formed by spaces between nearest adjacent first and second pin fins 18, 20, refer to FIG. 7) before it exits through the gas outlet end 16 of the heat sink 10.

Figure 1A:
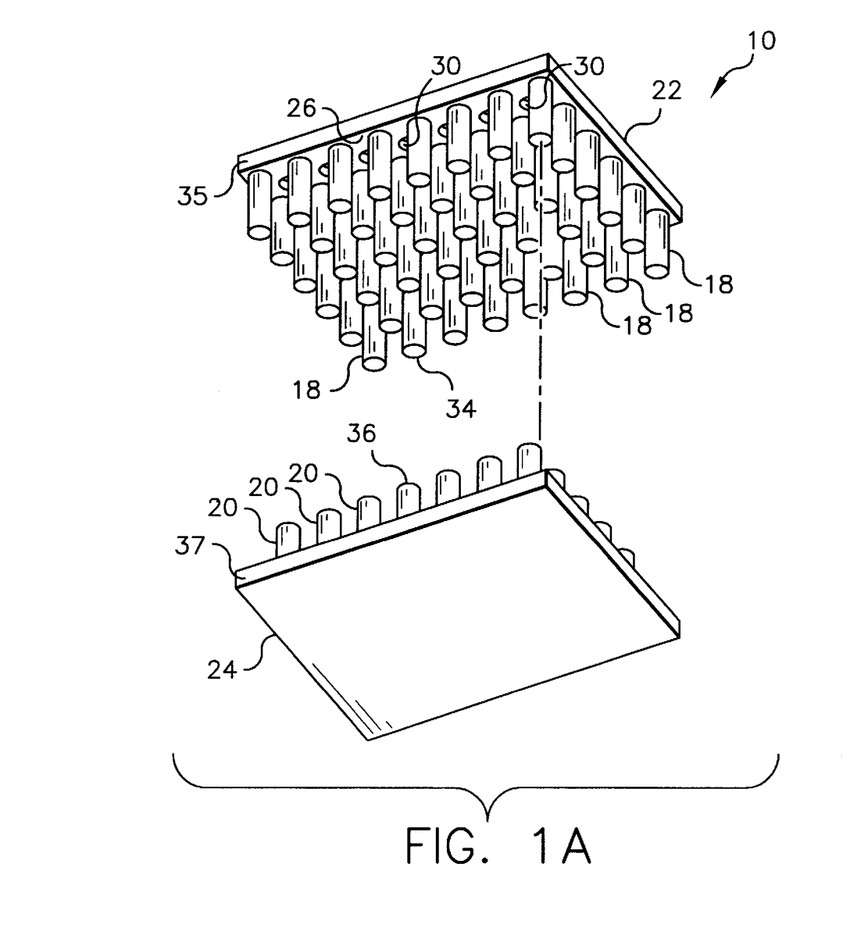
FIGS. 1(a) and 1(b) show exploded perspective views of the heat sink of the invention showing pin fins in first and second base members aligned for bonding.
Figure 1B:
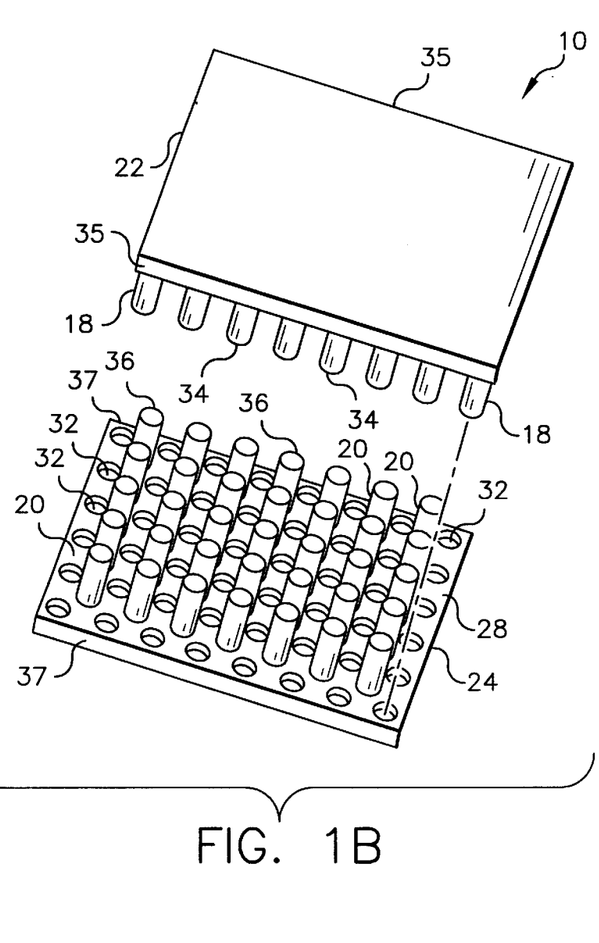
Figure 2A:
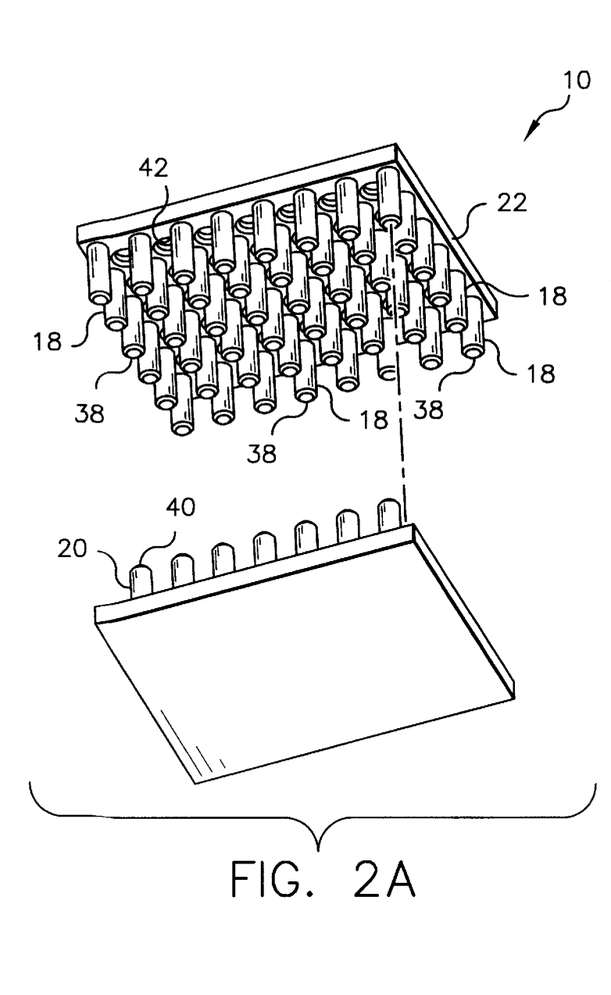
FIGS. 2(a) and 2(b) show exploded perspective views of an alternative embodiment of the invention with first and second base members having chamfered pin fins and recesses aligned for bonding.
Figure 2B:
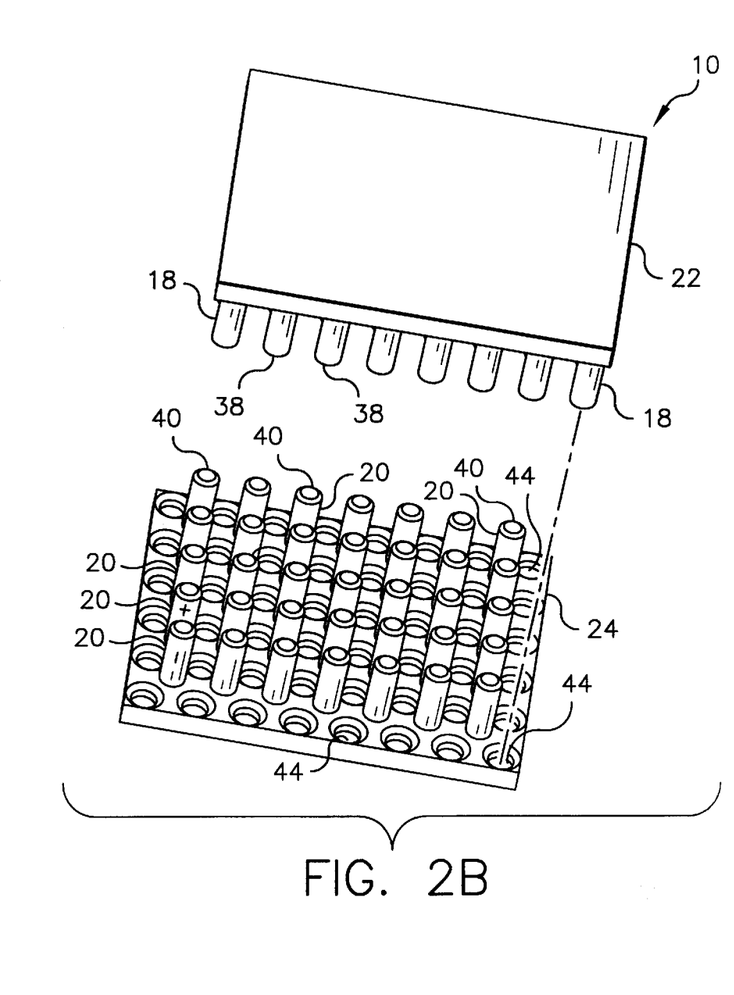

According to FIGS. 1–3, first and second fins 18, 20 are arranged (as described below) for bonding, respectively, to second and first opposing base members 22, 24. More specifically, first base member 22 has a plurality of spaced, substantially parallel first fins 18 extending substantially perpendicular from a common first face 26. Likewise, opposing second base member 24 has a plurality of spaced, substantially parallel second fins 20 extending substantially perpendicular from a common second face 28. Each of the plurality of fins 18, 20 is spatially separated from a nearest adjacent fin by recess 30, 32 (described below) formed, respectively, in common first and second faces 26,28. Recesses 30, 32 in base members 22, 24 are generally similarly configured, although they may have different configurations, such as depths and diameters.

Base members 22, 24 and pin fins 18, 20 are preferably cast from a variety of commercially available thermally conductive nonferrous materials, for instance, zinc alloys, copper, copper alloys, magnesium, aluminum and a mixture thereof. In our preferred embodiment we used copper alloys which has the advantage of high thermal conductivity. Skilled artisans will, however, appreciate that other means of forming pin fins 18, 20 may be utilized, for instance, an impact extrusion process.

Figure 6:
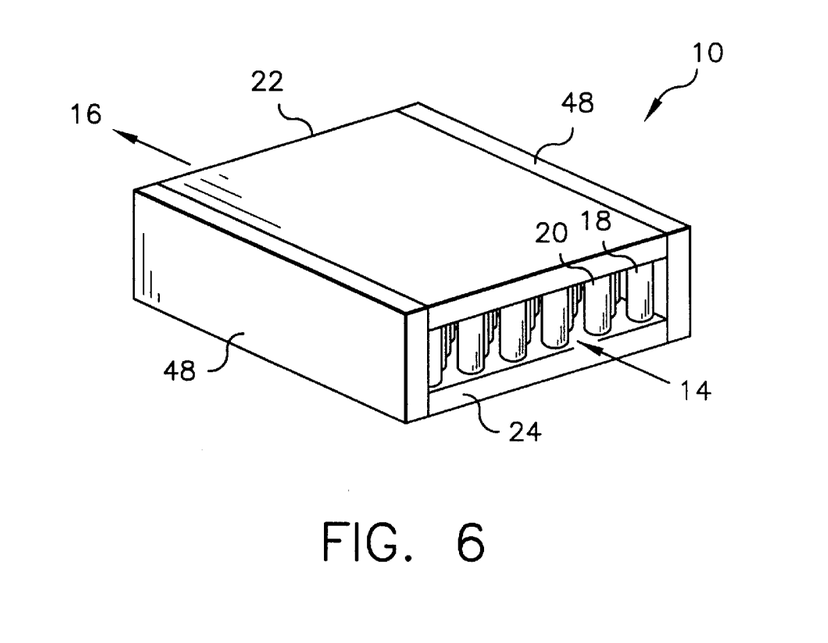
FIG. 6 is a perspective view of the assembled heat sink having side fluid flow shields; and, FIG. 7 is a plan view, partially torn away, illustrating the gap between adjacent pin fins in the heat sink.
Figure 7:
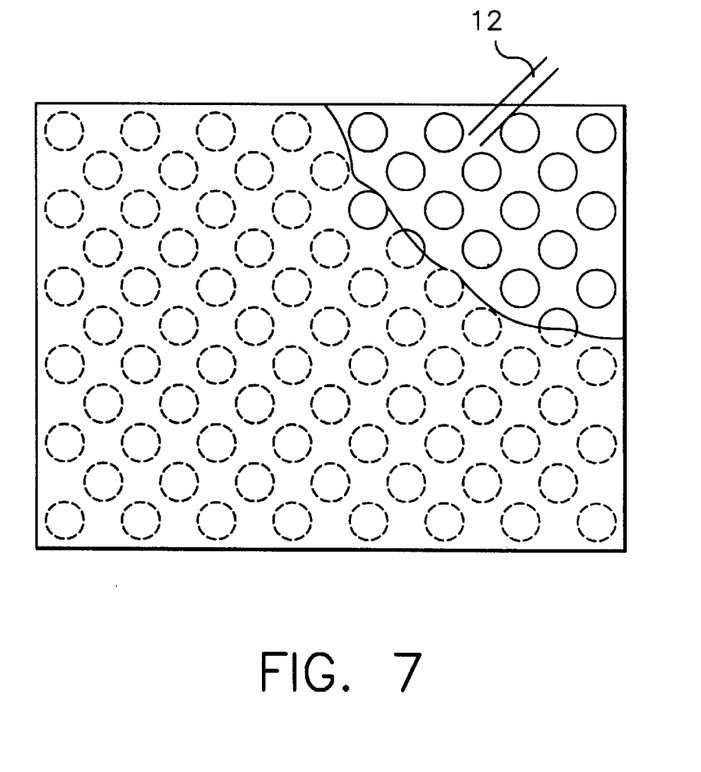

Referring again to FIGS. 1–3, in the preferred embodiment, pin fins 18, 20, have the same dimensions (height and diameter) and geometry for simplicity of manufacture and use, as described in details below. We prefer generally cylindrical shaped fins 18, 20, alternately referred to as pin fins, which when assembled in the manner described below form a plurality of closed spaced gas passageways 12. Referring to FIG. 6, heat sink 10 may have a pair of fluid flow shields 48 affixed to opposing lateral end edges 35, 37 (illustrated in FIG. 1A) of first and second base members 22, 24 of the heat sink 10. Fluid flow shields 48 serve to contain and direct the gas flow from the gas inlet 14 to the gas outlet end 16 of the heat sink 10. In an alternative embodiment, pin fins 18, 20 may each have a chamfered top end edge 38, 40 and the common first and second faces 26, 28 may have chamfered recesses 42, 44. As seen in FIG. 2, chamfering both the top end edges 34, 36 and the associated recesses 30, 32 facilitates guiding the pin fins 18, 20 easily into a recess 42, 44 in an opposing base member 22, 24, as described further below.

Figure 3A:
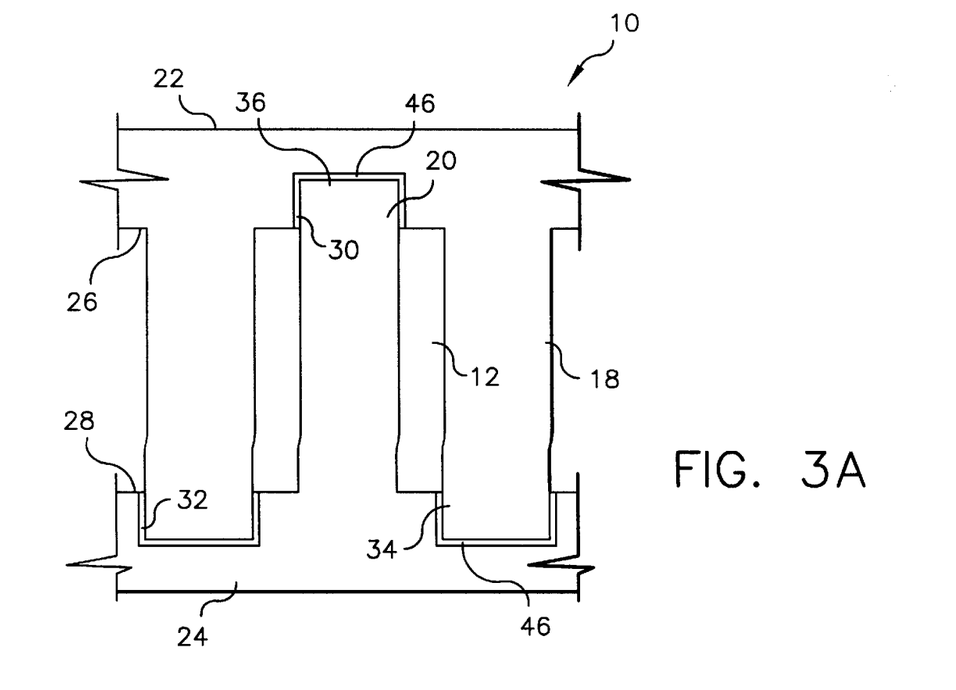
FIGS. 3(a) and 3(b) show enlarged fragmentary views of fins bonded in the cast first and second base members of the invention.
Figure 3B:
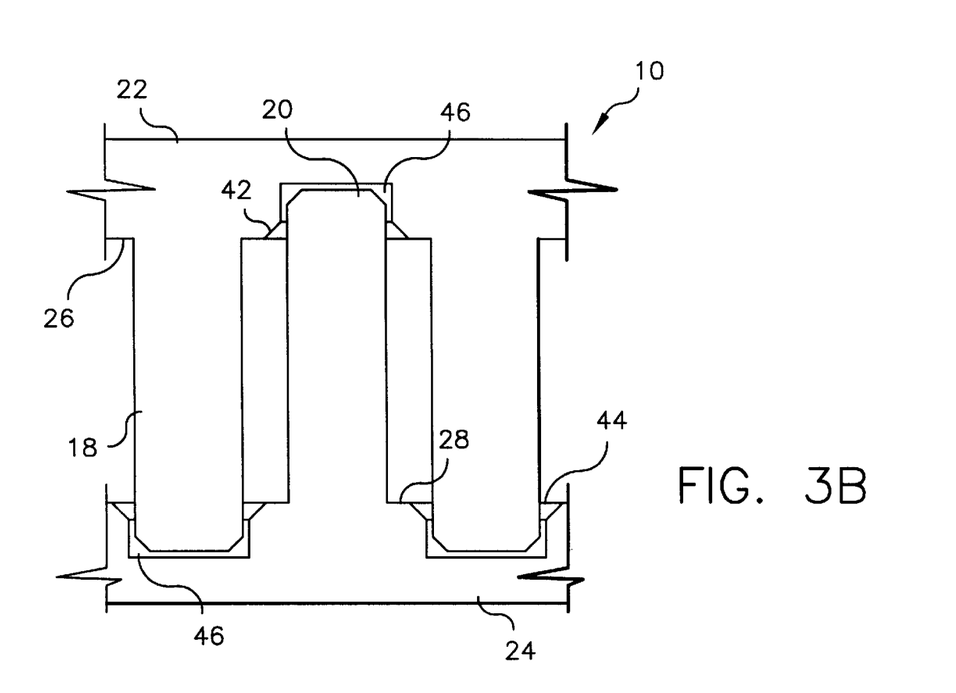
Figure 4:
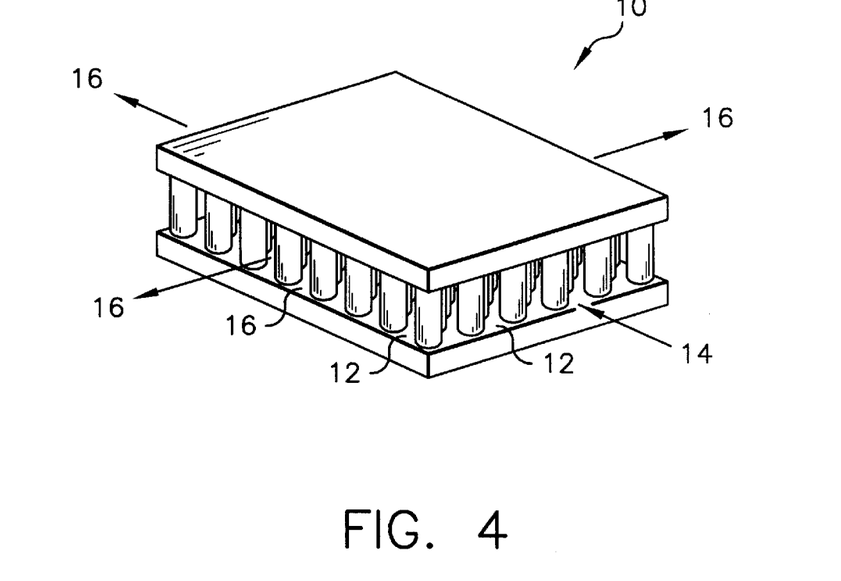
FIG. 4 is a perspective view of the assembled heat sink of the invention showing plurality of gas flow passageways.

As depicted in FIG. 3, it is important to the invention that the plurality of second fins 20 extending from the common second face 28 of second base member 24 be arranged for bonding to common first face 26 of first base member 22. Similarly, the plurality of first fins 18 extending from the first base member 22 is arranged for bonding to common second face 28 of the second opposing base member 24. In this way, nearest alternate adjacent pin fins 18, 20 in the assembled heat sink 10 are orderly arranged to form a plurality of gas passageways 12 passing through the heat sink 10 from the gas inlet end 14 to the gas outlet end 16.

Referring again to FIG. 3, the depth of the recesses 30, 32 is not important although we prefer that each recess 30, 32 be slightly larger than the diameter of the pin fins 18, 20 for securing the pin fins 18, 20 against movement. In general, however, the depth of the recesses 30, 32 is determined by the specific application of the heat sink. Further, the top end edge 34, 36 of each of the fins 18, 20 is bonded into a respective recess 30, 32 to secure the pin fins 18, 20 against movement. We prefer using a bonding layer 46, for instance, an epoxy resin, although other bonding materials may be used such as vacuum brazing or soldering.

Compared to cast pin finned heat sinks in the prior art, our invention has double the pin finned density. Skilled artisans will appreciate that pin finned density in existing heat sinks have large spacing between the centerlines of adjacent pin fins. It is well known that this spacing limitation is determined by the casting process. In contradistinction, our heat sink 10 has about twice the number of pin fins 18, 20 with approximately equal numbers being in each mating fin base members 22, 24. When the two base members 22, 24 are bonded together, as discussed above, the surface area available for heat transfer is approximately doubled since the number of pin fins 18, 20 is approximately doubled. This reduces the resistance of the heat flow to about one-half of the pin fins 18, 20 thereby making the heat sink more efficient. In addition, only ½ of the pin fins 18, 20 have a bonded joint at the opposing heat sink base member 22, 24 thus leading to improved heat transfer as well as increased structural performance.

An exemplary heat sink 10 of the invention formed using a die cast process includes a first base member 22 made from an aluminum alloy having a first pin fin 18 diameter of about 0.08 inches (0.203 cm) and a height of about 0.200 inches (0.51 cm). Centerline spacing, i.e., distance between nearest adjacent first pin fins 18, is 0.220 inches (0.56 cm). Based on this dimensions of the first base member 22, the actual gap between first pin fins 18 is about 0.150 inches (0.38 cm). Second base member 24 also cast from aluminum alloy has a plurality of second fins 20 having the same diameter and height as the first fins 18. When the pin fins 18, 20 are bonded into recesses 30 32 of respective opposing base members 22, 24, the pin fins 18, 20 are orderly arranged and spaced from one another by about 0.076 inches (0.19 cm) defining the gas passageways 12 of the heat sink 10. Thus, in contrast to conventional pin-finned heat sinks, there are approximately twice the number of pin fins 18, 20 in the present invention occupying substantially the same volume of space.

Another exemplary heat sink 10 of the invention formed using an investment casting process includes a first base member 22 cast from aluminum alloy wherein the first pin fins 18 diameter is 0.070 inches (0.18 cm) and height is 0.600 inches (1.5 cm). In this case, the centerline between nearest adjacent first pin fins 18 is 0.130 inches. Thus, the actual gap width between first pin fins 18 is 0.060 inches (0.15 cm). Similarly, cast second base member has second pin fins 20 having the same dimensions as the first pin fins 18. When the first and second base members 22, 24 are bonded together as described above, heat sink 10 formed thereby has a plurality of very narrow gas passageways 12, i.e., spacing between nearest adjacent first and second pin fins 18, 20, having a width of 0.022 inches (0.06 cm) with approximately twice the number of pin fins 18, 20 compared to a conventional pin finned heat sink.

In another embodiment of the invention, a method of making a thermally efficient heat sink 10 (represented in FIGS. 1–6) includes the steps of providing a mold (not shown) for casting first and second base members 22, 24, as described above; and, then casting the first and second base members 22, 24. According to this embodiment, first and second base members 22, 24 each has a plurality of spaced first and second fins 18, 20 and similarly configured and arranged in recesses 30, 32 formed in a respective common first and second faces 26, 28 of the respective base member 22, 24.

After the first and second base members 22, 24 are cast, they are then removed from mold and prepared for assembling in accordance with the invention. The common first face 26 of the first base member 22 is aligned with the common second face 28 of the second base member 24 such that the first fins 18 are arranged for being received by the recess 32; and, the second fins 20 are arranged for being received by the recess 30. A bonding layer 46, such as an epoxy resin, is applied to either of the recess 30, 32 and the first and second fins 18, 20. The first and second pin fins 18, 20 are then inserted into the respective recesses 30, 32 in a predetermined fashion in which nearest adjacent first and second pin fins 18, 20 form a plurality of gas passageways 12 through which fluid, such as air, heated by a heat generating body can pass unidirectionally from an inlet end to the outlet end of the heat sink 10, as described above.

Figure 5A:
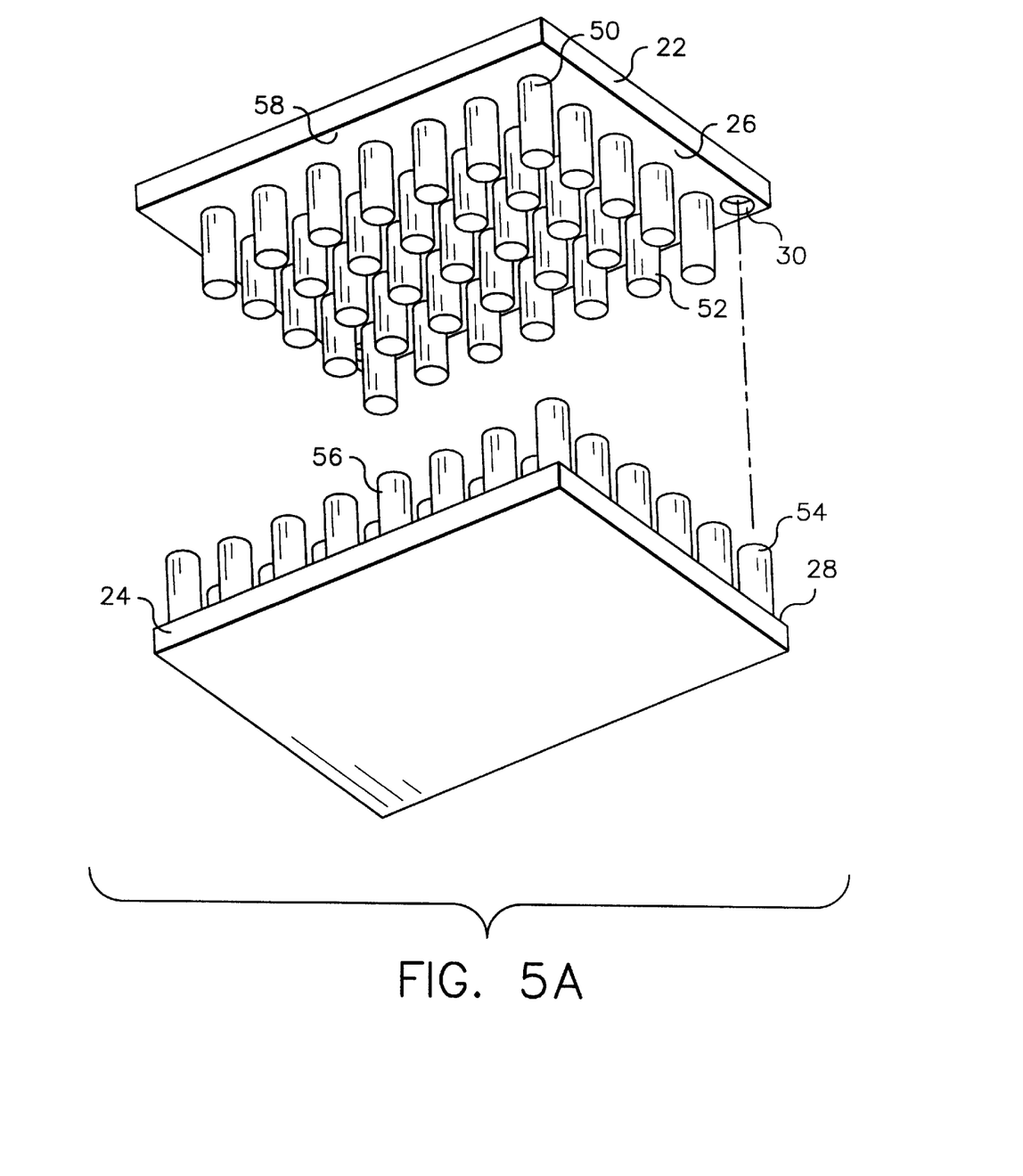
FIG. 5 shows an exploded perspective view of an alternative embodiment of the invention.

According to FIGS. 5A & 6, in another embodiment of the invention, heat sink 10 may comprise opposing first and second base members 22, 24, as described above. In this embodiment, however, first base member 22 has a plurality of spaced, substantially parallel, first and second fins 50, 52 each extending substantially perpendicular from a common first face 26, but with the first fins 50 being somewhat longer than second fins 52. Likewise, the second base member 24 has a plurality of spaced, substantially parallel, third and fourth fins 54, 56 extending from a common second face 28 with the third fins 54 being somewhat longer than the fourth fins 56.

Figure 5B:
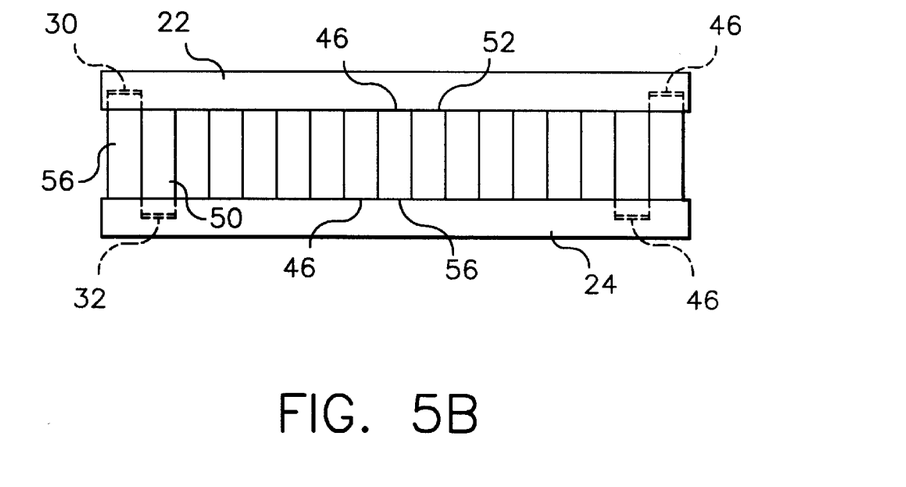

Illustrated in FIG. 5, first means, preferably a plurality of recesses 30, is provided in the common first face 26 for receiving at least two of the plurality of spaced third pin fins 54. Each of the fourth pin fins 56 not secured in a recess 30 are arranged for abutting contact with the common first face 26 of the opposing base member 22. Similarly, second means, preferably a plurality of recesses 32, is provided in the common second face 28 for receiving at least two of the plurality of spaced first pin fins 50. Second fins 52 not secured in a recess 32, i.e., the shorter fins, are configured for making abutting contact with the common face 28 of the opposing base member 22.

PARTS LIST

10 . . . assembled heat sink
12 . . . gas passageway
14 . . . gas inlet end of heat sink 10
16 . . . gas outlet end of heat sink 10
18 . . . first pin fins
20 . . . second pin fins
22 . . . first base member
24 . . . second base member
26 . . . common first face of member 22
28 . . . first recesses in member 22
30 . . . common second face of member 24
32 . . . second recesses in member 24
34 . . . top edge of first pin fins
36 . . . top edge of second pin fins
38 . . . chamfered end of first pin fins
40 . . . chamfered end of second pin fins
42 . . . chamfered recesses in member 22
44 . . . chamfered recesses in member 24
46 . . . bonding layer
48 . . . air flow shields
50 . . . first pin fins in alternative embodiment
52 . . . second pin fins in alternative embodiment
54 . . . third pin fins in alternative embodiment
56 . . . fourth pin fins in alternative embodiment While the invention has been described with a certain degree of particularity, it is manifest that many changes may be made in the details of construction and the arrangement of components without departing from the spirit and scope of this disclosure. It is understood that the invention is not limited to the embodiment set forth herein for purposes of exemplification, but is to be limited only by the scope of the attached claims, including the full range of equivalency to which each element thereof is entitled.

What is claimed is:

1. A heat sink, comprising:
   a first base member having a plurality of spaced, substantially parallel, first and second pin fins each extending substantially perpendicular from a common first face, said first fins being somewhat longer than said second fins;
   a second base member having a plurality of spaced, substantially parallel, third and fourth pin fins extending from a common second face, said third pin fins being somewhat longer than said fourth pin fins, and, said common second face being arranged for opposing said common first face of said first base member;
   a first means provided in said common first face for receiving at least two of said plurality of spaced third pin fins;
   a second means provided in said common second face for receiving at least two of said plurality of spaced first pin fins; and,
   means for fixing said spaced third pin fins against movement in each of said first means for receiving and said spaced first pin fins against movement in each of said second means for receiving, wherein any nearest adjacent spaced apart first, second, third and fourth pin fins form a narrow fluid passageway therebetween.

2. The heat sink recited in claim 1, wherein said first means for receiving comprises at least two first recesses formed in the first base member, and said second means for receiving comprises at least two second recesses formed in the second base member, each of said at least two first and second recesses being configured to receive at least a lead end portion of a respective mating first and third pin fins.

3. The heat sink recited in claim 2, wherein said means for fixing comprises bonding each one of said plurality of spaced first pin fins into a corresponding one of said plurality of second recesses, and bonding each one of said plurality of spaced third pin fins into a corresponding one of said plurality of first recesses.

4. The heat sink recited in claim 2, wherein said spaced third pin fins are bonded to said first recesses and said spaced first pin fins are bonded to said second recesses by vacuum brazing.

5. The heat sink recited in claim 4, wherein said spaced third pin fins are bonded to said first recesses and said spaced first fins are bonded to said second recesses by soldering.

6. The heat sink recited in claim 1, wherein said at least two first and second recesses and each of said first and third fins include a chamfered end edge for guiding each of said pin fins into one of said at least two first and second recesses.

7. The heat sink recited in claim 1, wherein each of said first, second third and fourth pin fins have a generally cylindrical shape.

8. The heat sink recited in claim 1, wherein said second and fourth pin fins are in proximate abutting bonded contact with a respective common first and second common face of said first and second base members.

9. The heat sink recited in claim 8, wherein a portion of said second pin fins are in proximate abutting bonded contact with said common second face of said second base member.

10. The heat sink recited in claim 8, wherein said first and second base members are made of a nonferrous material.

11. The heat sink recited in claim 1, wherein said first and second base members are selected from the group consisting of:
    (a) aluminum alloys;
    (b) zinc alloys;
    (c) magnesium alloys;
    (d) copper alloys; and,
    (e) mixtures thereof.

12. The heat sink recited in claim 2, wherein said first and second base members comprising copper alloys are vacuum brazed in said respective first and second recesses.

13. The heat sink recited in claim 11, wherein said first and second base members comprising copper alloys are soldered in said respective first and second recesses.

14. The heat sink recited in claim 1, wherein said first pin fins fixed in said second recesses and said second fins fixed in said first recesses form a close packed spaced arrangement defining fluid flow channels therebetween of said first and second pin fins.

* * * * *

UNITED STATES PATENT AND TRADEMARK OFFICE
CERTIFICATE OF CORRECTION

PATENT NO. : 5,829,514
DATED : November 03, 1998
INVENTOR(S) : Dean L. Smith, et al.

It is certified that error appears in the above-identified patent and that said Letters Patent is hereby corrected as shown below:

Column 7, line 41:
In claim 4, delete "recited in claim 2" and replace with --recited in claim 3--.

Column 8, line 1:
In claim 5, delete "recited in claim 4" and replace with --recited in claim 3--.

Column 8, line 4
In claim 6, delete "recited in claim 1" and replace with --recited in claim 2--.

Column 8, line 15
In claim 9, delete "recited in claim 8" and replace with --recited in claim 1--.

Column 8, line 19
In claim 10, delete "recited in claim 8" and replace with --recited in claim 1--.

Column 8, line 29
In claim 12, delete "recited in claim 2" and replace with --recited in claim 11--.

Signed and Sealed this

Thirtieth Day of March, 1999

Attest:

*Attesting Officer*

Q. TODD DICKINSON

*Acting Commissioner of Patents and Trademarks*